(12) United States Patent
Holt et al.

(10) Patent No.: US 9,236,397 B2
(45) Date of Patent: Jan. 12, 2016

(54) FINFET DEVICE CONTAINING A COMPOSITE SPACER STRUCTURE

(71) Applicant: GLOBALFOUNDRIES INC., Grand Cayman (KY)

(72) Inventors: Judson R. Holt, Wappingers Falls, NY (US); Jinghong Li, Poughquag, NY (US); Sanjay Mehta, Niskayuna, NY (US); Alexander Reznicek, Troy, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/172,365

(22) Filed: Feb. 4, 2014

(65) Prior Publication Data

US 2015/0221676 A1    Aug. 6, 2015

(51) Int. Cl.
| | |
|---|---|
| *H01L 27/12* | (2006.01) |
| *H01L 27/088* | (2006.01) |
| *H01L 21/8234* | (2006.01) |
| *H01L 29/16* | (2006.01) |
| *H01L 21/84* | (2006.01) |
| *H01L 29/66* | (2006.01) |
| *H01L 21/02* | (2006.01) |
| *H01L 21/265* | (2006.01) |

(52) U.S. Cl.
CPC ...... *H01L 27/1211* (2013.01); *H01L 21/02247* (2013.01); *H01L 21/02252* (2013.01); *H01L 21/02255* (2013.01); *H01L 21/26506* (2013.01); *H01L 21/823431* (2013.01); *H01L 21/845* (2013.01); *H01L 27/0886* (2013.01); *H01L 29/16* (2013.01); *H01L 29/66545* (2013.01); *H01L 29/66795* (2013.01)

(58) Field of Classification Search
CPC ............ H01L 27/1211; H01L 27/0886; H01L 21/823431; H01L 29/66545; H01L 29/66795; H01L 29/6681; H01L 21/26506; H01L 21/02252; H01L 21/845
See application file for complete search history.

(56) References Cited

U.S. PATENT DOCUMENTS

| | | | |
|---|---|---|---|
| 7,402,856 B2 | 7/2008 | Brask et al. | |
| 7,485,516 B2 | 2/2009 | Dyer et al. | |
| 7,498,632 B2 | 3/2009 | Lee | |
| 7,514,346 B2 * | 4/2009 | Chau et al. | 438/591 |
| 7,709,910 B2 | 5/2010 | Henson | |
| 7,898,040 B2 | 3/2011 | Nawaz | |
| 8,192,641 B2 | 6/2012 | Johnson | |
| 8,445,334 B1 * | 5/2013 | Basker et al. | 438/149 |
| 8,987,837 B2 * | 3/2015 | Cheng et al. | 257/401 |
| 8,993,384 B2 * | 3/2015 | Hung | H01L 29/7848 438/149 |
| 8,993,406 B1 * | 3/2015 | Kerber et al. | 438/413 |
| 2004/0217420 A1 * | 11/2004 | Yeo et al. | 257/347 |
| 2005/0242395 A1 * | 11/2005 | Chen et al. | 257/347 |
| 2009/0020819 A1 * | 1/2009 | Anderson et al. | 257/365 |
| 2009/0101978 A1 * | 4/2009 | Anderson et al. | 257/365 |
| 2009/0321828 A1 * | 12/2009 | Chen et al. | 257/347 |
| 2010/0207208 A1 | 8/2010 | Bedell et al. | |
| 2010/0252816 A1 * | 10/2010 | Ko et al. | 257/24 |

(Continued)

*Primary Examiner* — Matthew Landau
*Assistant Examiner* — Grant Withers
(74) *Attorney, Agent, or Firm* — Scully, Scott, Murphy & Presser, P.C.

(57) ABSTRACT

A composite spacer structure is formed on vertical sidewalls of a gate structure that is formed straddling a semiconductor fin. In one embodiment, the composite spacer structure includes an inner low-k dielectric material portion and an outer nitride material portion.

18 Claims, 8 Drawing Sheets

(56) References Cited

U.S. PATENT DOCUMENTS

| | | | |
|---|---|---|---|
| 2011/0101455 A1* | 5/2011 | Basker et al. | 257/347 |
| 2011/0147711 A1* | 6/2011 | Pillarisetty et al. | 257/24 |
| 2011/0193141 A1* | 8/2011 | Lin et al. | 257/255 |
| 2012/0025312 A1* | 2/2012 | Scheiper et al. | 257/347 |
| 2012/0153387 A1* | 6/2012 | Murthy et al. | 257/335 |
| 2013/0052801 A1* | 2/2013 | Berliner et al. | 438/468 |
| 2013/0134506 A1* | 5/2013 | Yagishita | 257/330 |
| 2013/0154006 A1* | 6/2013 | Basker et al. | 257/347 |
| 2013/0200459 A1* | 8/2013 | Adam et al. | 257/348 |
| 2013/0228830 A1* | 9/2013 | Lee et al. | 257/288 |
| 2013/0270561 A1* | 10/2013 | Cheng et al. | 257/57 |
| 2013/0285155 A1* | 10/2013 | Glass et al. | 257/369 |
| 2013/0299771 A1* | 11/2013 | Youn et al. | 257/9 |
| 2013/0299914 A1* | 11/2013 | Kim | 257/369 |
| 2013/0307076 A1* | 11/2013 | Cheng et al. | 257/350 |
| 2014/0061814 A1* | 3/2014 | Kim et al. | 257/369 |
| 2014/0061820 A1* | 3/2014 | Reznicek et al. | 257/401 |
| 2014/0061917 A1* | 3/2014 | Kim et al. | 257/751 |
| 2014/0106528 A1* | 4/2014 | Quyang et al. | 438/275 |
| 2014/0151806 A1* | 6/2014 | Basker et al. | 257/347 |
| 2014/0167163 A1* | 6/2014 | Cheng et al. | 257/347 |
| 2014/0191330 A1* | 7/2014 | Cheng et al. | 257/390 |
| 2014/0203335 A1* | 7/2014 | Song et al. | 257/288 |
| 2014/0217483 A1* | 8/2014 | Choi et al. | 257/288 |
| 2014/0231872 A1* | 8/2014 | Colinge et al. | 257/192 |
| 2014/0231891 A1* | 8/2014 | Basker et al. | 257/296 |
| 2014/0231915 A1* | 8/2014 | Leobandung | 257/347 |
| 2014/0239395 A1* | 8/2014 | Basker et al. | 257/347 |
| 2014/0264592 A1* | 9/2014 | Oxland et al. | 257/347 |
| 2014/0264597 A1* | 9/2014 | Kim et al. | 257/347 |
| 2014/0273359 A1* | 9/2014 | Kim et al. | 438/156 |
| 2014/0273369 A1* | 9/2014 | Wei et al. | 438/232 |
| 2014/0284719 A1* | 9/2014 | Khakifirooz et al. | 257/351 |
| 2014/0312387 A1* | 10/2014 | Kim | 257/192 |
| 2014/0312398 A1* | 10/2014 | Ching et al. | 257/288 |
| 2014/0312420 A1* | 10/2014 | Adam et al. | 257/347 |
| 2014/0346607 A1* | 11/2014 | Ching et al. | 257/369 |
| 2015/0041918 A1* | 2/2015 | Wann et al. | 257/401 |
| 2015/0069527 A1* | 3/2015 | Kerber et al. | 257/401 |
| 2015/0084001 A1* | 3/2015 | Cheng et al. | 257/29 |
| 2015/0084101 A1* | 3/2015 | Adam et al. | 257/288 |
| 2015/0091094 A1* | 4/2015 | Wan | H01L 27/1211 257/369 |
| 2015/0214226 A1* | 7/2015 | Su | H01L 27/0886 257/401 |
| 2015/0228776 A1* | 8/2015 | Xie | H01L 29/78 257/288 |

* cited by examiner

FINFET DEVICE CONTAINING A COMPOSITE SPACER STRUCTURE

BACKGROUND

The present application relates to a semiconductor structure and a method of forming the same. More particularly, the present application relates to a FinFET device containing a composite spacer structure that includes an inner low-k dielectric material portion and an outer nitride material portion.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of CMOS devices. FinFETs are non-planar semiconductor devices which include at least one semiconductor fin protruding from a surface of a substrate. A gate dielectric can be formed in direct physical contact with each vertical sidewall of the at least one semiconductor fin and, optionally, in direct physical contact with a topmost surface of the semiconductor fin. A gate conductor can be formed on the gate dielectric and straddling a portion of the at least one semiconductor fin. FinFETs can increase the on-current per unit area relative to planar field effect transistors.

SUMMARY

A composite spacer structure is formed on vertical sidewalls of a gate structure that is formed straddling a semiconductor fin. In one embodiment, the composite spacer structure includes an inner low-k dielectric material portion and an outer nitride material portion.

In one aspect of the present application, a method of forming a FinFET device is provided. In accordance with an embodiment of the present application, the method can include providing a plurality of semiconductor fins on a surface of a substrate. Next, at least one gate structure that is orientated perpendicular to and straddling each semiconductor fin of the plurality of semiconductor fins is formed. A composite spacer structure is then provided on vertical sidewalls of each gate structure. In accordance with the present application, the composite spacer structure comprises an inner low-k dielectric material portion and an outer nitride material portion. Next, a source-side doped semiconductor material portion is epitaxially grown on an exposed surface of each semiconductor fin and on one side of each gate structure and a drain-side doped semiconductor portion is epitaxially grown on another exposed surface of each semiconductor fin and on another side of each gate structure.

In another aspect of the present application, a FinFET device is provided. In accordance with an embodiment of the present application, the FinFET device of the present application can include a plurality of semiconductor fins located on a surface of a substrate, at least one gate structure orientated perpendicular to and straddling each semiconductor fin of the plurality of semiconductor fins, and a composite spacer structure located on vertical sidewalls of each gate structure, wherein the composite spacer structure comprises an inner low-k dielectric material portion and an outer nitride material portion. The FinFET device can also include a source-side doped semiconductor material portion on an exposed surface of each semiconductor fin and on one side of each gate structure and a drain-side doped semiconductor portion on another exposed surface of each semiconductor fin and on another side of each gate structure.

DETAILED DESCRIPTION

Figure 1A:
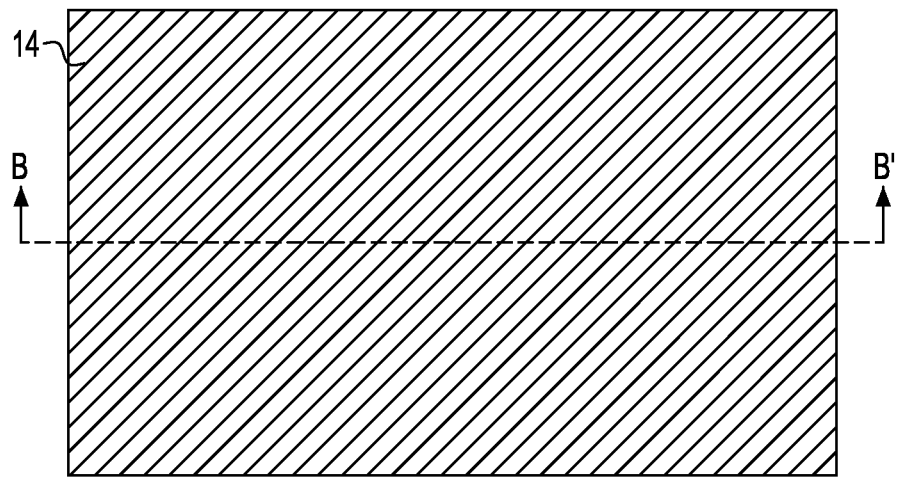
FIG. 1A is a top-down view of a first exemplary semiconductor structure including, from bottom to top, a handle substrate, an insulator layer and a semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals. In the drawings, various views are shown including a top-down view (i.e., FIGS. 1A, 2A, 3A, 4A, 5A, 6A, 7A and 8A) and a vertical-cross sectional view (i.e., FIGS. 1B, 2B, 3B, 4B, 5B, 6B, 7B and 8B) through B-B' which is through a plane in which a semiconductor fin is present.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Due to tight spacing in 14 nm and 10 nm node FinFET devices, nitride spacers are not sufficient anymore to reduce or eliminate capacitance between contact structures and a gate structure. The distance between the contact structure and the gate structure is only a few nanometers. A low-k dielectric spacer material such as, for example, SiOCN or SiOBN, has been proposed as a solution. The term "low-k" as used throughout the present application denotes a dielectric material that has a dielectric constant of less than silicon dioxide. Unfortunately, the aforementioned low-k dielectric spacer materials are not great in selectivity regarding selective epitaxial growth. During selective epitaxial growth, nodules form on the low-k dielectric spacers. The present application provides a composite spacer structure that provides improved capacitance control to a FinFET device and is selective in terms of selective epitaxial growth. The composite spacer structure of the present application, which may also be referred to as a double spacer, includes an inner low-k dielectric material portion and an outer nitride material portion.

Figure 1B:
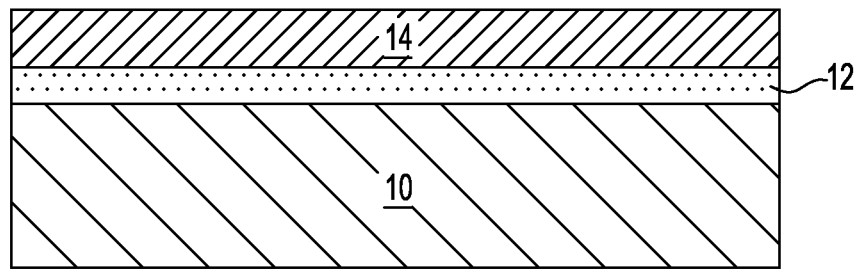
FIG. 1B is a cross sectional view of the first exemplary semiconductor structure of FIG. 1A along the vertical plane B-B'.

Referring first FIGS. 1A-1B, there are illustrated a first exemplary semiconductor structure including, from bottom to top, a handle substrate 10, a insulator layer 12 and an semiconductor material layer 14 that can be employed in accordance with an embodiment of the present application. Collectively, the handle substrate 10, the insulator layer 12 and the semiconductor material layer 14 may be referred to as a semiconductor-on-insulator (SOI) substrate. Although the present application is described and illustrated utilizing an SOI substrate, other semiconductor substrates can also be used including, for example, a semiconductor substrate in which handle substrate 10 is omitted, or a bulk semiconductor substrate in which the entirety of the semiconductor substrate is comprised of a semiconductor material.

In the embodiment illustrated in FIGS. 1A-1B, the semiconductor material layer 14 is present on an uppermost surface of the insulator layer 12. The insulator layer 12 is present on an uppermost surface of the handle substrate 10. The handle substrate 10 provides mechanical support to the insulator layer 12 and the semiconductor material layer 14.

In some embodiments of the present application, the handle substrate 10 and the semiconductor material layer 14 of the SOI substrate may comprise a same semiconductor material. In other embodiments of the present application, the handle substrate 10 and the semiconductor material layer 14 of the SOI substrate may comprise a different semiconductor material. The term "semiconductor" as used herein in connection with the semiconductor material of the handle substrate 10 and the semiconductor material layer 14 denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 10 and the semiconductor material layer 14. In one embodiment, the handle substrate 10 and the semiconductor material layer 14 are both comprised of silicon. In some embodiments, the handle substrate 10 is a non-semiconductor material including, for example, a dielectric material and/or a conductive material.

The handle substrate 10 and the semiconductor material layer 14 may have the same or different crystal orientation. For example, the crystal orientation of the handle substrate 10 and/or the semiconductor material layer 14 may be {110}, {110}, or {111}. Other crystallographic orientations besides those specifically mentioned can also be used in the present application. The handle substrate 10 and/or the semiconductor material layer 14 of the SOI substrate may be a single crystalline semiconductor material, a polycrystalline material, or an amorphous material. Typically, at least the semiconductor material layer 14 is a single crystalline semiconductor material. In some embodiments, the semiconductor material layer 14 that is located atop the insulator layer 12 can be processed to include semiconductor regions having different crystal orientations.

The insulator layer 12 of the SOI substrate may be a crystalline or non-crystalline oxide or nitride. In one embodiment, the insulator layer 12 is an oxide such as, for example, silicon dioxide. The insulator layer 12 may be continuous or it may be discontinuous. When a discontinuous insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of semiconductor material layer 14 of the SOI substrate is typically from 10 nm to 100 nm, with a thickness from 50 nm to 70 nm being more typical. In some embodiments, and when an ETSOI (extremely thin semiconductor-on-insulator) substrate is employed, semiconductor material layer 14 of the SOI can have a thickness of less than 10 nm. If the thickness of the semiconductor material layer 14 is not within one of the above mentioned ranges, a thinning step such as, for example, planarization or etching can be used to reduce the thickness of semiconductor material layer 14 to a value within one of the ranges mentioned above. The insulator layer 12 of the SOI substrate typically has a thickness from 1 nm to 200 nm, with a thickness from 100 nm to 150 nm being more typical. The thickness of the handle substrate 10 of the SOI substrate is inconsequential to the present application.

The semiconductor material layer 14 may be doped, undoped or contain doped and undoped regions therein. For clarity, the doped regions are not specifically shown in the drawings of the present application. Each doped region within the semiconductor material layer 14 may have the same, or they may have different conductivities and/or doping concentrations. The doped regions that are present in the semiconductor material layer 14 can be formed by ion implantation process or gas phase doping.

In some embodiments of the present application, a layer of hard mask material (not shown) such, as for example, silicon dioxide and/or silicon nitride, can be deposited on the exposed surface of the semiconductor material layer 14 prior to forming each semiconductor fin. During the subsequent formation of the semiconductor fins, a portion of the hard mask provides a fin cap on a topmost surface of each fin. In such a structure, the gate dielectric material portion to be subsequently formed is present only along the vertical sidewalls of each semiconductor fin. In the embodiment that is illustrated, no fin cap is present and as such, the gate dielectric material portion is present along the vertical sidewalls and on a topmost surface of each semiconductor fin.

Figure 2A:
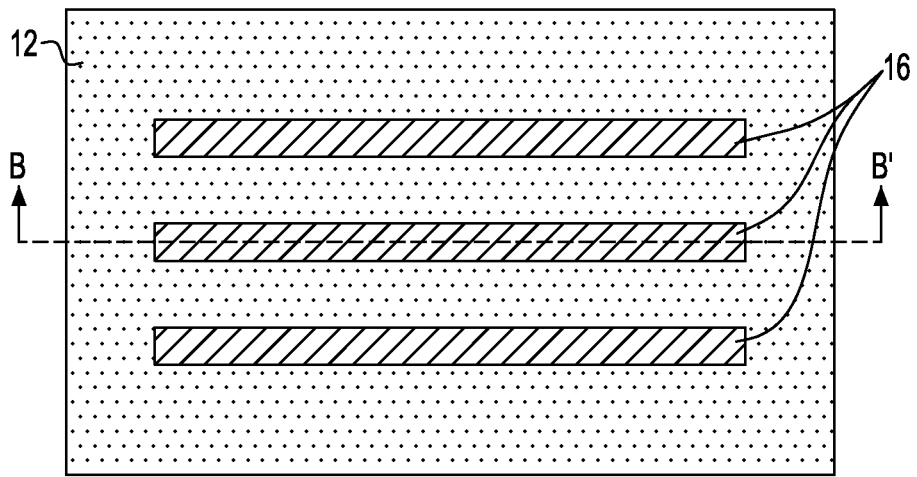
FIG. 2A is a top-down view of the first exemplary semiconductor structure of FIG. 1A after forming a plurality of semiconductor fins.
Figure 2B:
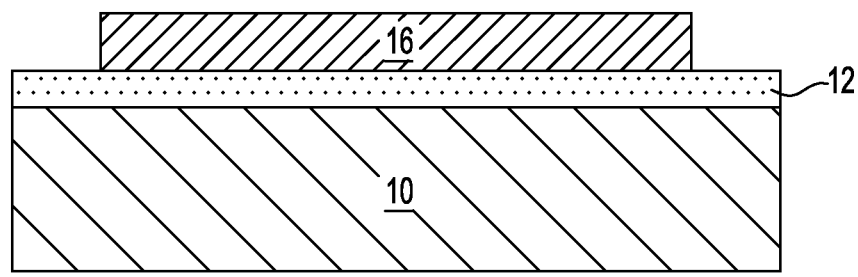
FIG. 2B is a cross sectional view of the first exemplary semiconductor structure of FIG. 2A along the vertical plane B-B'.

Referring now to FIGS. 2A-2B, there are illustrated the first exemplary semiconductor structure of FIGS. 1A-1B after forming a plurality of semiconductor fins. In the illustrated embodiment of the present application, each semiconductor fin 16 of the plurality of semiconductor fins has a bottommost surface that is located on a surface of the insulator layer 12. Thus, and in the illustrated embodiment, each semiconductor fin 16 is formed on a surface of a substrate that is provided by insulator layer 12. In such an embodiment, an interface is present between the bottommost surface of each semiconductor fin 16 and an upper surface of the insulator layer 12.

In other embodiments of the present application, and when a bulk semiconductor material is employed, each semiconductor fin 16 that is formed has a bottommost surface that is in contact with an underlying semiconductor material. In such an embodiment, no interface is present between the bottommost surface of each semiconductor fin 16 and an upper surface the underlying semiconductor material.

In the illustrated embodiment of the present application, each semiconductor fin 16 that is formed comprises a same semiconductor material as that of the semiconductor layer 14. When a bulk semiconductor is used as the semiconductor substrate instead of an SOI substrate, each semiconductor fin 16 that is formed comprises a same semiconductor material as that of an upper semiconductor material portion of the bulk semiconductor substrate.

Each semiconductor fin 16 of the plurality of semiconductor fins is spaced apart from its nearest neighboring semiconductor fin(s) 16. Also, each semiconductor fin 16 of the plurality of semiconductor fins is oriented parallel to each other. While the present application is illustrated with a plurality of semiconductor fins, embodiments in which a single semiconductor fin 16 is employed in lieu of a plurality of semiconductor fins are expressly contemplated herein.

As used herein, a "semiconductor fin" refers to a contiguous structure including a semiconductor material and including a pair of vertical sidewalls that are parallel to each other. As used herein, a surface is "vertical" if there exists a vertical plane from which the surface does not device by more than three times the root mean square roughness of the surface.

In one embodiment of the present application, each semiconductor fin 16 has a height from 10 nm to 100 nm, and a width from 4 nm to 30 nm. In another embodiment of the present application, each semiconductor fin 16 has a height from 15 nm to 60 nm, and a width from 5 nm to 12 nm.

The semiconductor structure shown in FIGS. 2A-2B can be formed by lithography and etching. Lithography can include forming a photoresist (not shown) on the topmost surface of the semiconductor material layer 14, exposing the photoresist to a desired pattern of radiation, and then developing the exposed photoresist with a conventional resist developer to provide a patterned photoresist atop the semiconductor material layer 14. At least one etch is then employed which transfers the pattern from the patterned photoresist into the semiconductor material layer 14 utilizing the underlying insulator layer 12 as an etch stop. In one embodiment, the etch used for pattern transfer may include a dry etch process such as, for example, reactive ion etching, plasma etching, ion beam etching or laser ablation. In another embodiment, the etch used for pattern transfer may include a sidewall image transfer (SIT) process. After transferring the pattern into the semiconductor material layer 14, the patterned photoresist can be removed utilizing a conventional resist stripping process such as, for example, ashing.

Figure 3A:
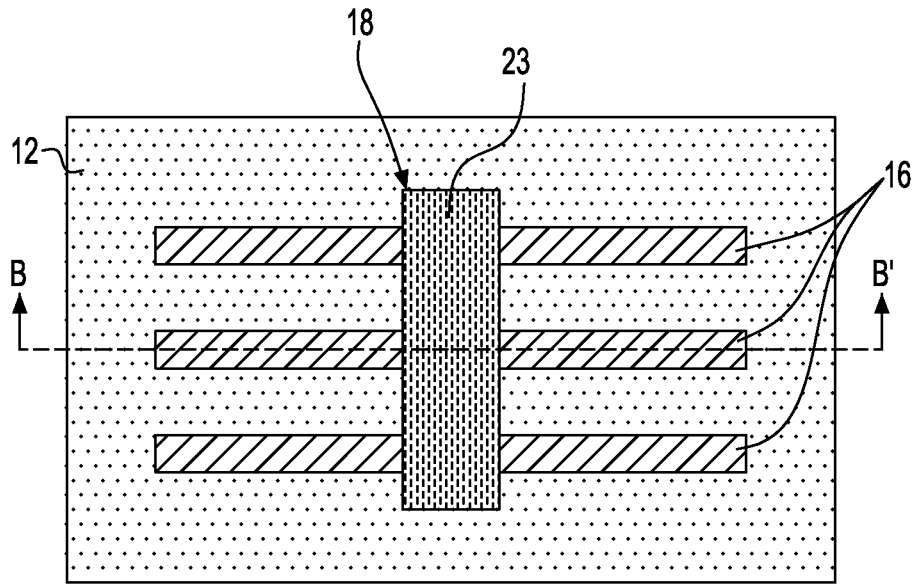
FIG. 3A is a top-down view of the first exemplary semiconductor structure of FIG. 2A after forming a gate structure that is oriented perpendicular to and that straddles each semiconductor fin.
Figure 3B:
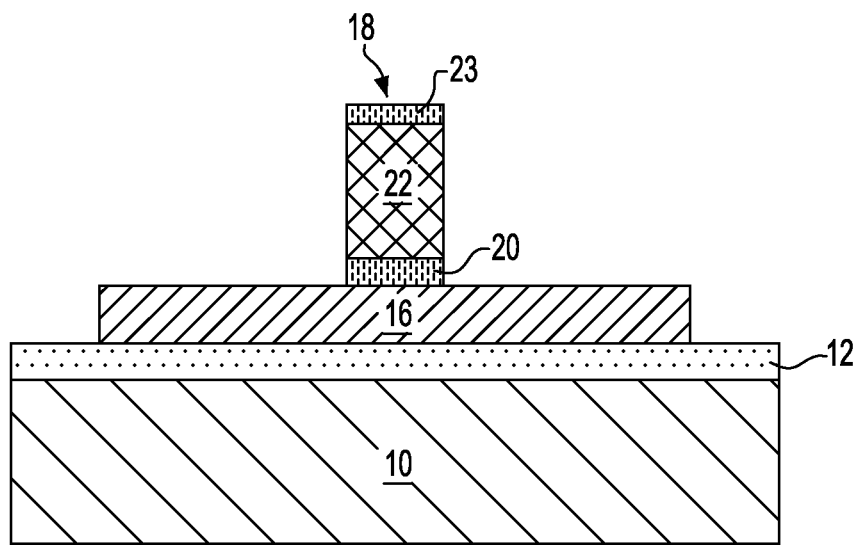
FIG. 3B is a cross sectional view of the first exemplary semiconductor structure of FIG. 3A along the vertical plane B-B'.

Referring now to FIGS. 3A-3B, there are illustrated the first exemplary semiconductor structure of FIGS. 2A-2B after forming a gate structure 18 that is oriented perpendicular to and that straddles each semiconductor fin 16. Although a single gate structure is shown, a plurality of gate structures can be formed in which each gate structure of the plurality of gate structures is spaced apart from one another, straddles each semiconductor fin 16 and is orientated perpendicular to each semiconductor fin 16.

The gate structure 18 can include a functional gate structure or a sacrificial gate structure. The term "functional gate structure" is used throughout the present application as a permanent gate structure used to control output current (i.e., flow of carriers in the channel) of a semiconducting device through electrical or magnetic fields. The term "sacrificial gate structure" is used throughout the present application to denote a material that serves as a placeholder structure for a functional gate structure to be subsequently formed. In one embodiment, each gate structure includes either a functional gate structure or a sacrificial gate structure. In yet another embodiment, a first set of gate structures can comprise a functional gate structure, while a second set of gate structures comprises a sacrificial gate structure. In such an embodiment, block mask technology can be used in forming the different gate structures. When a sacrificial gate structure is employed, the sacrificial gate structure can be replaced with a functional gate structure any time after the source and drain regions have been defined within the semiconductor fins.

In embodiments in which the gate structure 18 is a sacrificial gate structure (not shown in drawings), the sacrificial gate structure is formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure.

In the embodiment illustrated in FIGS. 3A-3B, the gate structure 18 is a functional gate structure that includes a gate dielectric material portion 20 and a gate conductor material portion 22. In some embodiments of the present application, a dielectric cap 23 can be located atop the gate conductor material portion 22. In other embodiments of the present application, dielectric cap 23 can be omitted from atop the gate material portion 22. The functional gate structure can be formed by first forming a gate dielectric material, gate conductor material and, if present, a dielectric cap material, and then patterning those materials by lithography and etching.

The gate dielectric material that provides the gate dielectric material portion 20 of the functional gate structure can be an oxide, nitride, and/or oxynitride. In one example, the gate dielectric material that provides the gate dielectric material portion 20 of the functional gate structure can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric material used in providing the gate dielectric material portion 20 can be formed by any deposition technique including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric material portion 20 can have a thickness in a range from 1 nm to 10 nm. Other thicknesses that are lesser than or greater than the aforementioned thickness range can also be employed for the gate dielectric material.

The gate conductor portion 22 comprises a gate conductor material. The gate conductor material used in providing the gate conductor material portion 22 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor material used in providing the gate conductor material portion 22 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor material portion 22 of the functional gate structure has a thickness from 1 nm to 100 nm. Other thicknesses that are lesser than or greater than the aforementioned thickness range can also be employed for the gate conductor material.

The dielectric cap material used in providing the dielectric cap 23 can be comprised of a dielectric oxide, nitride and/or oxynitride. In one example, silicon dioxide and/or silicon nitride can be used as the dielectric cap material. The dielectric cap material used in providing the dielectric cap 23 can be formed by a deposition process including, for example, chemical vapor deposition (CVD), plasma enhanced chemical vapor deposition (PECVD), physical vapor deposition (PVD), sputtering, or atomic layer deposition. In one embodiment of the present application, the dielectric cap material used in providing the dielectric cap 23 can have a thickness in a range from 25 nm to 100 nm. Other thicknesses that are lesser than or greater than the aforementioned thickness range can also be employed for the dielectric cap material.

Figure 4A:
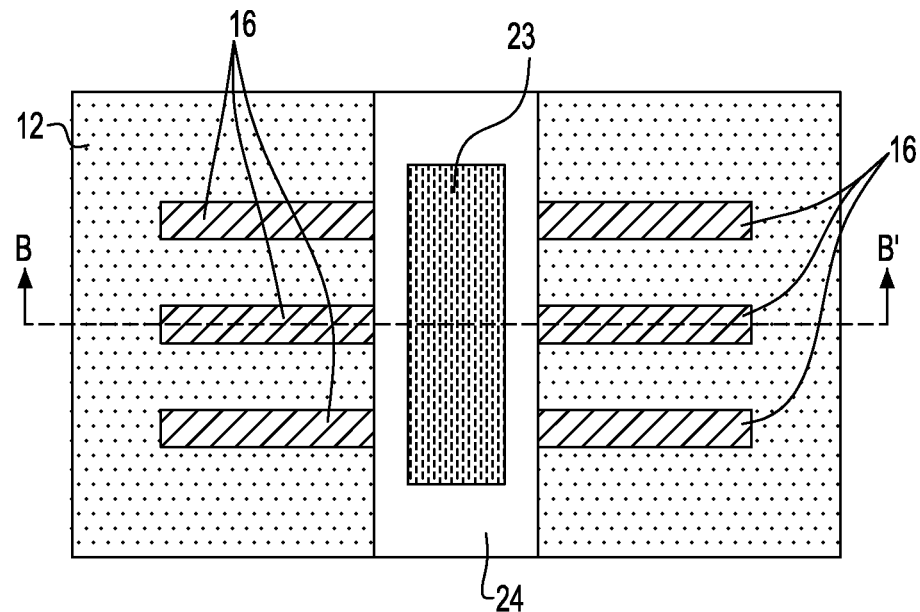
FIG. 4A is a top-down view of the first exemplary semiconductor structure of FIG. 3A after forming a dielectric spacer comprising a low-k dielectric material.
Figure 4B:
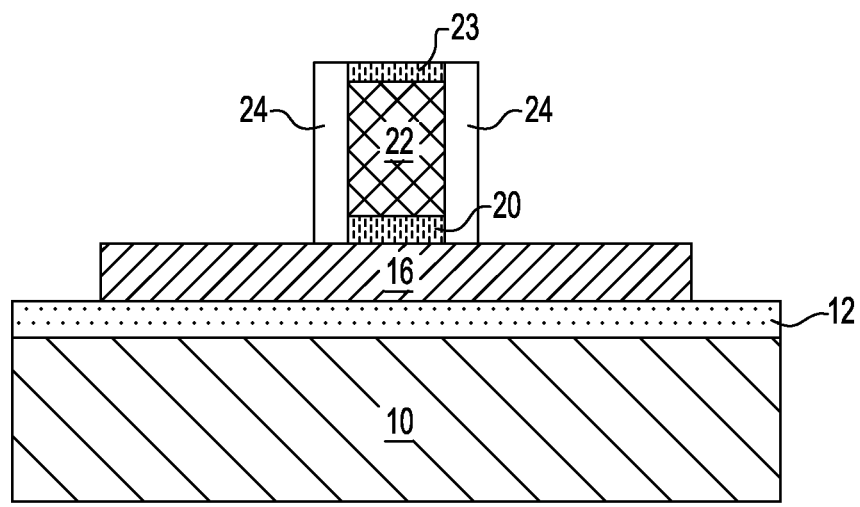
FIG. 4B is a cross sectional view of the first exemplary semiconductor structure of FIG. 4A along the vertical plane B-B'.

Referring now to FIGS. 4A-4B, there are illustrated the first exemplary semiconductor structure of FIGS. 3A-3B after forming a dielectric spacer 24 comprising a low-k dielectric material. As is shown, dielectric spacer 24 is formed on vertical sidewalls of each gate structure 18. Dielectric spacer 23 also straddles each semiconductor fin 16.

The term "low-k dielectric material" is used throughout the present application to denote a dielectric material having a dielectric constant of less than silicon nitride (i.e., k less than 7.5). In one embodiment of the present application, the low-k dielectric material that is used in forming dielectric spacer 24 can have a dielectric constant of from 2 to 6. In another embodiment of the present application, the low-k dielectric material that is used in forming dielectric spacer 24 can have a dielectric constant of from 2.5 to 5.5. Unless otherwise noted, all dielectric constants mentioned in the present application are measured in a vacuum.

Dielectric materials that have a dielectric constant that are less than silicon dioxide and that can be used in the present application include, for example, SiOCN, SiCBN, SiCOH, SiCN, and SiON dielectric materials. The dielectric spacer 24 can be formed by first providing a low-k dielectric material and then etching the low-k dielectric material. The spacer material can be provided by a deposition process including, for example, chemical vapor deposition (CVD), plasma enhanced chemical vapor deposition (PECVD), or spin-on coating. In some embodiments, deposition may take place at a temperature from 500° C. to 650° C. The etching of the low-k material may comprise a dry etch process such as, for example, a reactive ion etch.

Figure 5A:
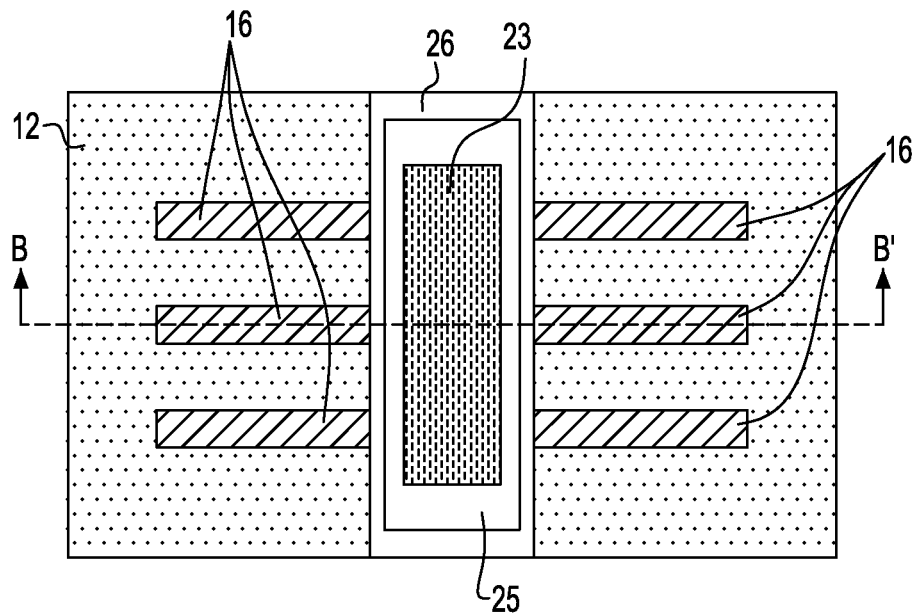
FIG. 5A is a top-down view of the first exemplary semiconductor structure of FIG. 4A after converting an outer surface of the dielectric spacer into a nitride material portion.
Figure 5B:
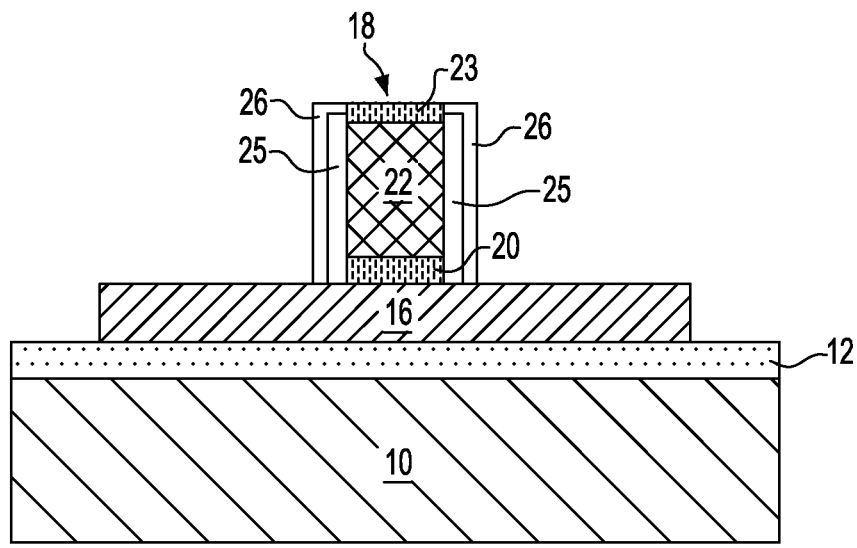
FIG. 5B is a cross sectional view of the first exemplary semiconductor structure of FIG. 5A along the vertical plane B-B'.

Referring now to FIGS. 5A-5B, there are illustrated the first exemplary semiconductor structure of FIGS. 4A-4B after converting an outer surface of the dielectric spacer 24 into an outer nitride material portion 24. The portion of the dielectric spacer 24 that remains after this conversion is referred to herein as inner low-k dielectric material portion 25. Collectively, inner low-k dielectric material portion 25 and outer nitride material portion 26 provide a composite spacer of the present application.

In some embodiments, the outer nitride portion 26 may include the same composition as the inner low-k dielectric material portion except that a higher nitrogen content is present in the outer nitride portion 26 as compared to the inner low-k dielectric material portion 25. In one embodiment, the nitrogen content in the outer nitride material portion 26 may range from 30 atomic percent nitrogen to 50 atomic percent nitrogen. In another embodiment, the nitrogen content in the outer nitride material portion 26 may range from 35 atomic percent nitrogen to 43 atomic percent nitrogen. In yet another embodiment, the outer nitride portion 26 has a higher dielectric constant than that of the inner low-k dielectric material portion 25.

After converting the dielectric spacer 24, and in one embodiment, the inner low-k dielectric material portion 25 may have a thickness from 2 nm to 15 nm, while the outer nitride portion may have a thickness from 1 nm to 5 nm. In another embodiment, the inner low-k dielectric material portion 25 may have a thickness from 4 nm to 10 nm, while the outer nitride portion may have a thickness from 2 nm to 4 nm.

The converting of the outer surface of the dielectric spacer 24 into an outer nitride material portion 26 can be achieved by introducing nitrogen into the outer surface of the dielectric spacer 24. In one embodiment of the present application, the introducing of nitrogen into the outer surface of the dielectric spacer 24 can be achieved utilizing a plasma nitridation process. The plasma nitridation process is carried out in a plasma-enhanced chemical vapor deposition reactor (PECVD). The wafers are subjected to $NH_3$ or $N_2$ plasma treatment. In one embodiment of the present application, the plasma nitridation process can be carried out at a temperature between 250° C. to 600° C. Higher or lower temperatures for performing the plasma nitridation are also possible. The longer the treatment the higher the nitrogen content in the outer spacer layer. Treatment duration is in the seconds to minutes range, 30 seconds to 10 minutes, while shorter or longer times can also be employed.

In another embodiment of the present application, the introducing of nitrogen into the outer surface of the dielectric spacer 24 can be achieved utilizing a decoupled plasma nitridation (DPN) process. In this embodiment, the dielectric spacer 24 is exposed to a high density $N_2$ or $NH_3$ pulsed RF plasma for nitridation. DPN uses inductive coupling to generate nitrogen plasma and incorporate nitrogen into the top surface layer of the dielectric spacer 24. DPN can be performed at room temperature (20° C.) up to 600° C. The final step of the DPN process is a high temperature anneal, a so-called post nitridation anneal (PNA), which can be performed in different atmospheres, i.e., nitrogen, oxygen, helium or other gases. In some embodiments of the present application, the PNA can be performed at a temperature from 800° C. to 1200° C. for a duration from 1 second to 10 minutes. In one example, the PNA is performed at 900° C. for 10 seconds to 60 seconds.

In yet another embodiment of the present application, the introducing of nitrogen into the outer surface of the dielectric spacer 24 can be achieved by ion implantation of nitrogen. In some embodiments, an anneal may follow the ion implantation process which induces a chemical reaction between the nitrogen being introduced and the composition of the dielectric spacer 24 at the outer surface.

In a further embodiment of the present application, the introducing of nitrogen into the outer surface of the dielectric spacer 24 can be achieved utilizing a rapid thermal anneal in a nitrogen-containing ambient. In this embodiment, the rapid thermal anneal may be performed at a temperature from 800° C. to 1200° C. as a spike anneal or for a time duration of 1 seconds to 60 seconds. Other temperatures and times are also contemplated and can be employed in the present application. The nitrogen-containing ambient may include ammonia ($NH_3$) or nitrogen ($N_2$).

In some embodiments of the present application, the outer surface of the dielectric spacer 24 can be modified to have a different etch selectivity as compared to the remaining inner low-k dielectric material portion 25. In such an embodiment, the outer surface of dielectric spacer 24 can be poisoned by adding a dopant atom such as, for example, arsenic, carbon or boron thereto. In such an embodiment, the composite spacer is comprised of the inner low-k dielectric material portion 25 and outer dopant material portion, instead of the outer nitride material portion 26.

In some embodiments of the present application, the composite spacer 25, 26 shown in FIGS. 5A-5B can be formed by omitting the separate formation of dielectric spacer 24 and subsequent converting step mentioned above and replacing those steps with a deposition step in which a graded spacer profile is formed. Notably, the graded spacer profile includes inner low-k dielectric material portion 25 and outer nitride material portion 26. In some embodiments of the present application, the graded spacer profile can be provided by first introducing precursors used in forming the inner low-k dielectric material portion 25, and then after a selected period of time, the nitrogen precursor content is increased, while decreasing the concentration of the other precursors used in providing the inner low-k dielectric material portion 25. In some embodiments, in which nitrogen is not present in the composition that provides the inner low-k dielectric material portion 25, the graded spacer profile can be provided by first introducing precursors used in forming the inner low-k dielectric material portion 25, and then after a selected period of time, a nitrogen precursor is added, while decreasing the concentration of the other precursors used in providing the inner low-k dielectric material portion 25.

Figure 6A:
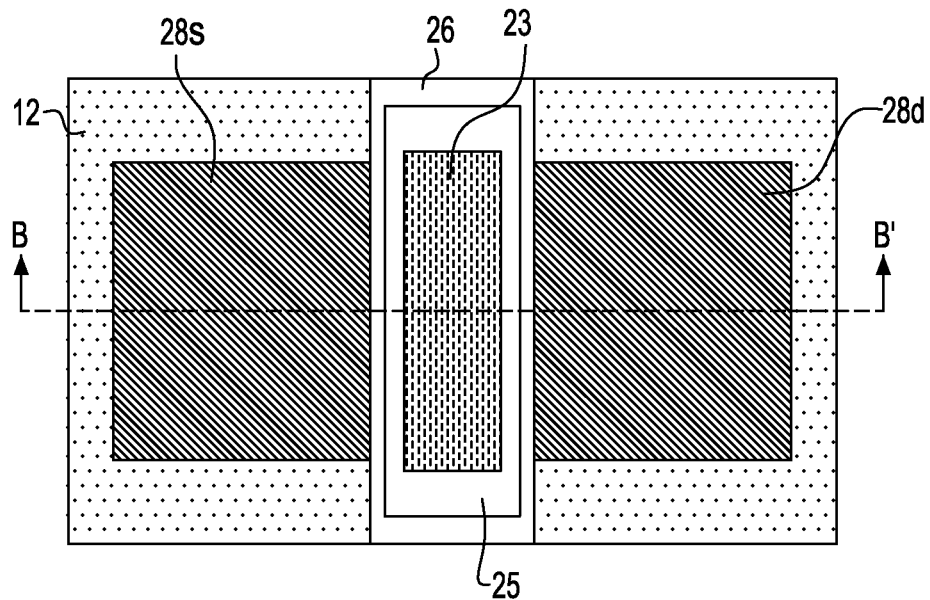
FIG. 6A is a top-down of the first exemplary semiconductor structure of FIG. 5A after forming a source-side doped semiconductor material portion on one side of the gate structure and a drain-side doped semiconductor material portion on another side of the gate structure.
Figure 6B:
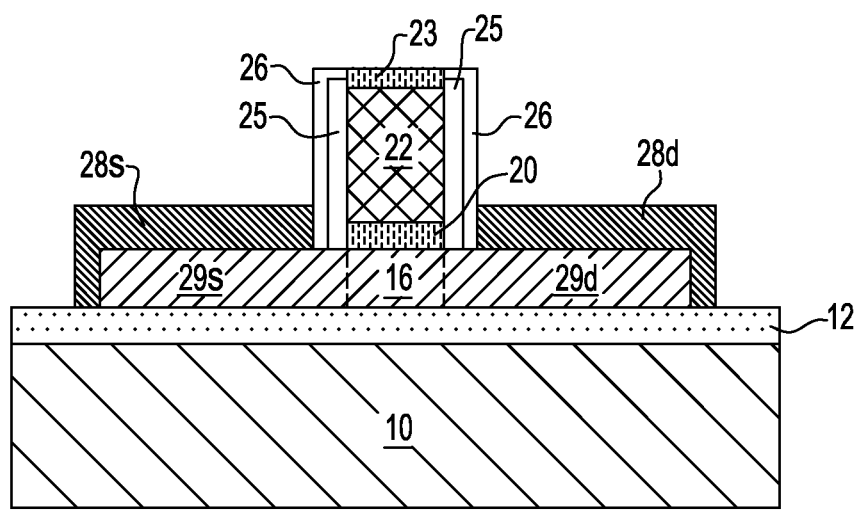
FIG. 6B is a cross sectional view of the first exemplary semiconductor structure of FIG. 6A along the vertical plane B-B'.

Referring now to FIGS. 6A-6B, there are illustrated the first exemplary semiconductor structure of FIGS. 5A-5B after forming a source-side doped semiconductor material portion 28s on one side of the gate structure 18 and a drain-side doped semiconductor material portion 28d on another side of the gate structure 18. In accordance with the present application, the source source-side doped semiconductor material portion 28s can be used in providing a source region of the FinFET device, while the drain-side doped semiconductor material portion 28d may be used in providing a drain region of the FinFET device.

The source-side doped semiconductor material portion 28s is epitaxially grown from the sidewalls and from the topmost surface of each semiconductor fin 16, and the drain-side doped semiconductor material portion 28d is epitaxially grown from the sidewalls and from the topmost surface of each semiconductor fin 16. The drain-side doped semiconductor material portion 28d is located between each semiconductor fin 16. As a consequence, the drain-side doped semiconductor material portion 28d merges each semiconductor fin 16 on one side of the gate structure 18. Similarly, the source-side doped semiconductor material portion 28s is located between each semiconductor fin 16. As a consequence, the source-side doped semiconductor material portion 28s merges each semiconductor fin 16 on another side of the gate structure 18.

In the embodiment illustrated, both the source-side doped semiconductor material portion 28s and the drain-side doped semiconductor material portion 28d have a topmost surface that is planar, i.e., flat. In this embodiment, the flat topmost surface of the source-side doped semiconductor material portion 28s and the flat topmost surface drain-side doped semiconductor material portion 28d can be achieved by over filling the epitaxial semiconductor material above each semiconductor fin. During the merge process, <111> bound diamond shaped epitaxy is grown around each semiconductor fin. Once the diamonds merge, <100> planes form between the diamonds, the epitaxial growth rate is much faster, resulting in a smoothed surface.

The source-side doped semiconductor material portion 28s includes an n-type (i.e., at least one element from Group VA of the Periodic Table of Elements (e.g., P and/or As)) or a p-type dopant (i.e., at least one element from Group IIIA of the Periodic Table of Elements (e.g., Al and/or B)) and at least one semiconductor material. The at least one semiconductor material of the source-side doped semiconductor material portion 28s may include any of the semiconductor materials mentioned above for semiconductor material layer 14. In one embodiment of the present application, the at least one semiconductor material of the source-side doped semiconductor material portion 28s is a same semiconductor material as that of semiconductor material layer 14. In another embodiment, the at least one semiconductor material of the source-side doped semiconductor material portion 28s is a different semiconductor material than semiconductor material layer 14. For example, when semiconductor material layer 14 is comprised of silicon, than the source-side doped semiconductor material portion 28s may be comprised of SiGe.

The drain-side doped semiconductor material portion 28d includes an n-type (i.e., at least one element from Group VA of the Periodic Table of Elements (e.g., P and/or As) or a p-type dopant (i.e., at least one element from Group IIIA of the Periodic Table of Elements (e.g., Al and/or B) and at least one semiconductor material. The at least one semiconductor material of the drain-side doped semiconductor material portion 28d may include any of the semiconductor materials mentioned above for semiconductor material layer 14. In one embodiment of the present application, the at least one semiconductor material of the drain-side doped semiconductor material portion 28d is a same semiconductor material as that of semiconductor material layer 14. In another embodiment, the at least one semiconductor material of the drain-side doped semiconductor material portion 28d is a different semiconductor material than semiconductor material layer 14. For example, when semiconductor material layer 14 is comprised of silicon, than the drain-side doped semiconductor material portion 28d may be comprised of SiGe.

In accordance with the present application, the at least one semiconductor material of the source-side doped semiconductor material portion 28s is a same semiconductor material as that of the at least one semiconductor material of the drain-side doped semiconductor material portion 28d.

The source-side doped semiconductor material portion 28s and the drain-side doped semiconductor material portion 28d can be formed by an in-situ doped epitaxial growth process. In the embodiment illustrated, the source-side doped semiconductor material portion 28s and the drain-side doped semiconductor material portion 28d are formed by a bottom-up epitaxial growth process. As such, the source-side doped semiconductor material portion 28s and the drain-side doped semiconductor material portion 28d have an epitaxial relationship with that of the underlying surface of the semiconductor material portion.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming the source-side doped semiconductor material portion 28s and the drain-side doped semiconductor material portion 28d of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the source-side doped semiconductor material portion 28s and the drain-side doped semiconductor material portion 28d typically ranges from 550° C. to 900° C. Although higher temperature typically results in faster deposition, the faster deposition may result in crystal defects and film cracking.

A number of different sources may be used for the deposition of the source-side doped semiconductor material portion 28s and the drain-side doped semiconductor material portion 28d. In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In addition to the above mentioned gases, the deposition of the source-side doped semiconductor material portion 28s and the drain-side doped semiconductor material portion 28d also includes a dopant source. In one example, the dopant source employed in forming the source-side doped semiconductor material portion 28s and the drain-side doped semiconductor material portion 28d can include phosphine ($PH_3$). In another example, the epitaxial deposition of the source-side doped semiconductor material portion 28s and the drain-side doped semiconductor material portion 28d includes a dopant gas present in a ratio to silane ($SiH_4$) ranging from 0.00001% to 2%.

In one embodiment, the dopant is present in the source-side doped semiconductor material portion 28s and the drain-side doped semiconductor material portion 28d in a concentration ranging from $1 \times 10^{19}$ atoms/cm$^3$ to $10^{21}$ atoms/cm$^3$. In another embodiment, dopant is present in the source-side doped semiconductor material portion 28s and the drain-side doped semiconductor material portion 28d in a concentration ranging $1 \times 10^{20}$ atoms/cm$^3$ to $8 \times 10^{20}$ atoms/cm$^3$. The concentration of dopant within the source-side doped semiconductor material portion 28s can be equal to, greater than, or less than the concentration of dopant within the drain-side doped semiconductor material portion 28d.

In one embodiment of the present application, the dopant can be uniformly present in the source-side doped semiconductor material portion 28s and/or the drain-side doped semiconductor material portion 28d. In another of the present application, the dopant can be present as a gradient in the source-side doped semiconductor material portion 28s and/or the drain-side doped semiconductor material portion 28d.

In some embodiments of the present application, the source-side doped semiconductor material portion 28s and/or the drain-side doped semiconductor material portion 28d can be hydrogenated. When hydrogenated, a hydrogen source is used in conjunction with the other source gases and the amount of hydrogen that is present within the source-side doped semiconductor material portion 28s and/or the drain-side doped semiconductor material portion 28d can be from 1 atomic percent to 40 atomic percent. In another embodiment, carbon can be present in the source-side doped semiconductor material portion 28s and/or the drain-side doped semiconductor material portion 28d. When present, a carbon source (such as, for example, mono-methylsilane) is used in conjunction with the other source gases and carbon, C, can be present in the source-side doped semiconductor material portion 28s and/or the drain-side doped semiconductor material portion 28d in range from 0 atomic % to 4 atomic %.

The thickness of the source-side doped semiconductor material portion 28s and the drain-side doped semiconductor material portion 28d may range from 2 nm to 100 nm. In another embodiment, the thickness of the source-side doped semiconductor material portion 28s and the drain-side doped semiconductor material portion 28d ranges from 5 nm to 50 nm. The source-side doped semiconductor material portion 28s may have a thickness that is equal to, greater than, or less than the thickness of the drain-side doped semiconductor material portion 28d.

After forming the source-side doped semiconductor material portion 28s and the drain-side doped semiconductor material portion 28d, an anneal is performed. The anneal causes diffusion of dopant, e.g., phosphorus, from the source-side doped semiconductor material portion 28s downwards into a portion of the semiconductor fin 16 forming a source region 29s, and diffusion of dopant, e.g., phosphorus, from the drain-side doped semiconductor material portion 28s downwards into another portion of the second fin 16 and formation of a drain region 29d. The anneal process used in forming the source region 29s and the drain region 29d may be a rapid thermal anneal, furnace annealing, flash annealing, laser annealing or any suitable combination of those techniques. The annealing temperature may range from 600° to 1300° C. with an anneal time ranging from a millisecond to 30 minutes. In one embodiment, the annealing is done by a flash anneal process at about 1200° C. for twenty (20) milliseconds.

In some embodiments in which the gate structure 18 is a sacrificial gate structure, the sacrificial gate structure can now be replaced by a functional gate structure, as described above. The removal of the sacrificial gate structure includes an etching process that forms a gate cavity which can then be filled with a gate dielectric portion and a gate conductor portion. In another embodiment, the sacrificial gate structure can be removed after providing the structure shown in FIGS. 7A-7B or even after forming the structure shown in FIGS. 8A-8B. In some embodiments in which a sacrificial gate structure is replaced with a functional gate structure, the gate dielectric material portion is present only within a bottom portion of each gate cavity. In another embodiment of the present application (not shown), the gate dielectric material portion includes vertically extending portions that directly contact exposed vertical sidewalls of each composite spacer structure. In such an embodiment, each vertically extending portion of gate dielectric material portion laterally separates the gate conductor material portion from the vertical sidewall surfaces of the composite spacer structure of the present application.

Figure 7A:
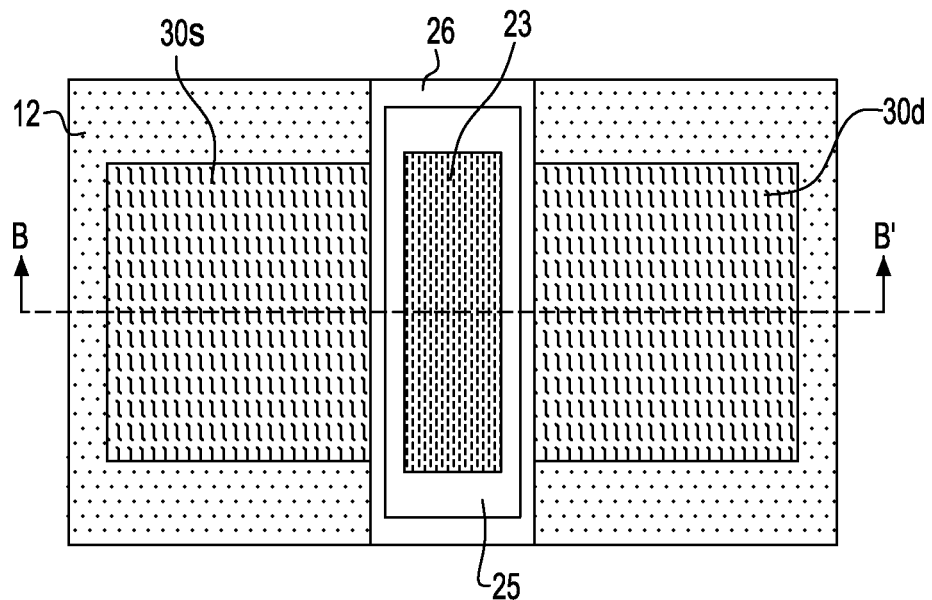
FIG. 7A is a top-down of the first exemplary semiconductor structure of FIG. 6A after providing a source-side metal semiconductor alloy portion on the source-side doped semiconductor material portion, and a drain-side metal semiconductor alloy portion on the drain-side doped semiconductor material.
Figure 7B:
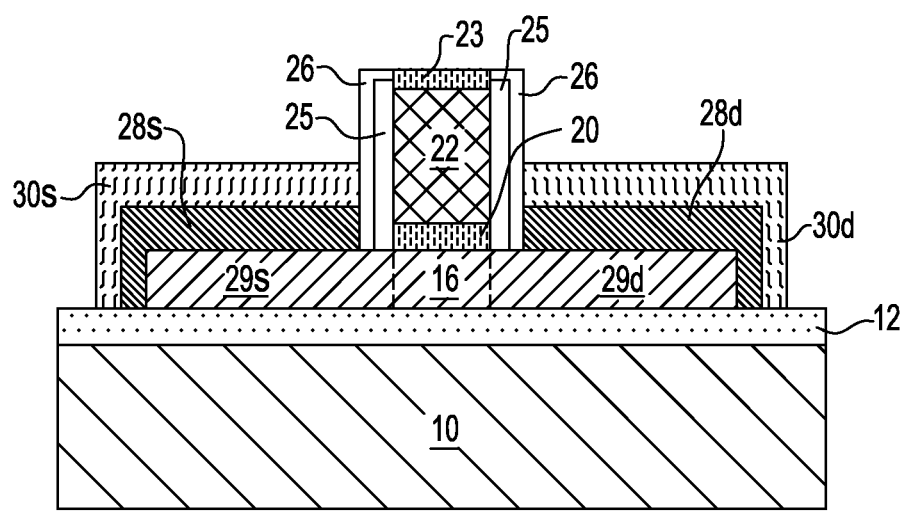
FIG. 7B is a cross sectional view of the first exemplary semiconductor structure of FIG. 7A along the vertical plane B-B'.

Referring now to FIGS. 7A-7B, there are illustrated the first exemplary semiconductor structure of FIGS. 6A-6B after providing a source-side metal semiconductor alloy portion 30s on the source-side doped semiconductor material portion 28s, and a drain-side metal semiconductor alloy portion 30d on the drain-side doped semiconductor material 28d.

The source-side metal semiconductor alloy 30s and the drain-side metal semiconductor alloy 30d can be formed by first depositing a metal semiconductor alloy forming metal such as, for example, Ni, Pt, Co, and alloys such as NiPt, on a surface source-side doped semiconductor material portion 28s and on a surface of the drain-side doped semiconductor material portion 28d. An optional diffusion barrier layer such as, for example, TiN or TaN, can be deposited atop the metal semiconductor alloy forming metal. An anneal is then performed that causes reaction between the metal semiconductor alloy forming metal and the semiconductor material within source-side doped semiconductor material portion 28s and the drain-side doped semiconductor material portion 28d. After annealing, any unreactive metal including the diffusion barrier layer can be removed. When Ni is used the NiSi phase is formed due to its low resistivity. For example, formation temperatures include 400° C.-600° C. In the present application, the source-side metal semiconductor alloy 30s and the drain-side metal semiconductor alloy 30d includes a same metal semiconductor alloy forming metal.

The source-side metal semiconductor alloy 30s that is formed includes a metal semiconductor alloy forming metal, a semiconductor material as present within the source-side doped semiconductor material portion 28s and a dopant as also present in the source-side doped semiconductor material portion 28s. The drain-side metal semiconductor alloy 30d that is formed includes a metal semiconductor alloy forming metal, a semiconductor material as present within the drain-side doped semiconductor material portion 28d, and also a dopant as also present in the drain-side doped semiconductor material portion 28d.

The thickness of the source-side metal semiconductor alloy 30s and the drain-side metal semiconductor alloy 30d may range from 2 nm to 50 nm. In another embodiment, the thickness of the source-side metal semiconductor alloy 30s and the drain-side metal semiconductor alloy 30d ranges from 5 nm to 25 nm. The source-side metal semiconductor alloy 30s may have a thickness that is equal to, greater than, or less than the thickness of the drain-side metal semiconductor alloy 30d.

Figure 8A:
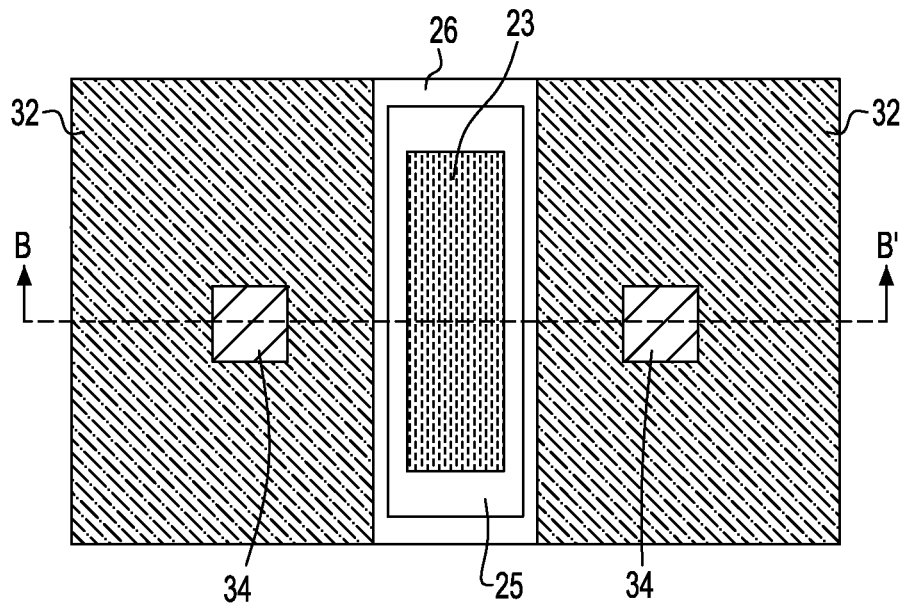
FIG. 8A is a top-down of the first exemplary semiconductor structure of FIG. 7A after forming a dielectric material that includes at least one contact structure.
Figure 8B:
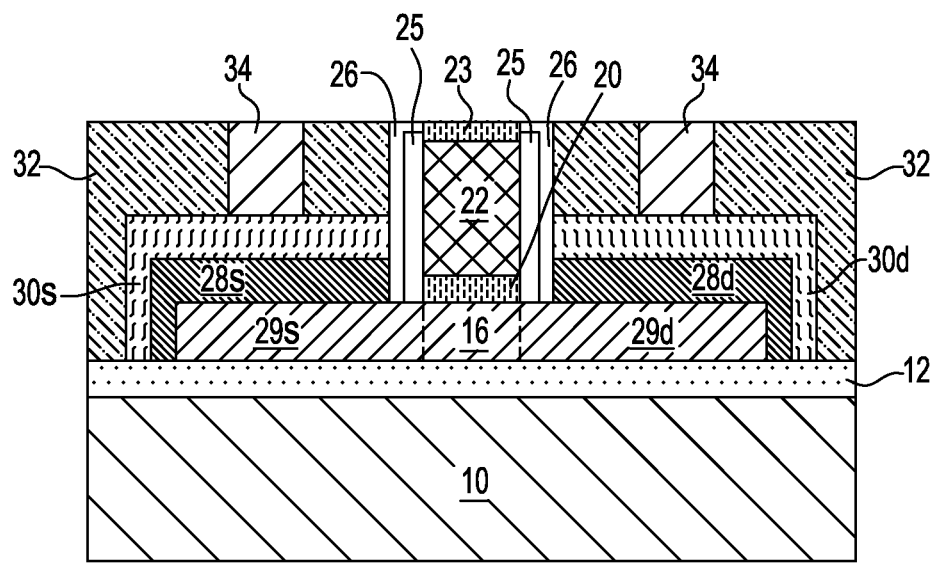
FIG. 8B is a cross sectional view of the first exemplary semiconductor structure of FIG. 8A along the vertical plane B-B'.

Referring now to FIGS. 8A-8B, there are illustrated the first exemplary semiconductor structure of FIGS. 7A-7B after forming a dielectric material 32 containing at least one contact structure 34. In some embodiments (and as shown in FIGS. 8A-8B), the dielectric material 32 may have an upper surface that is coplanar with an upper surface of each gate structure 18 and an upper surface of the outer nitride material portion 26. As such, the upper surface of the each gate structure 18 may be exposed after forming the dielectric material 32. In other embodiments (not shown), the dielectric material 32 may have an upper surface that is vertically offset and located above with an upper surface of each gate structure 18 and an upper surface of the nitride material portion 26.

In some embodiments, the dielectric material 32 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the dielectric material 32. The use of a self-planarizing dielectric material as dielectric material 32 may avoid the need to perform a subsequent planarizing step.

In one embodiment, the dielectric material 32 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 32, a planarization process or an etch back process follows the deposition of the dielectric material. The thickness of the dielectric material 32 that can be employed in the present application may vary depending on the type of dielectric material employed as well as the method that was employed in forming the same. In one embodiment, the dielectric material 32 has a thickness from 80 nm to 500 nm. Other thicknesses that are greater or lesser than the range provided above can also be used for the dielectric material 32.

After providing the dielectric material 32, at least one contact structure 34 can be formed that extends down to a surface of at least one of the source-side metal semiconductor alloy 30s and the drain-side metal semiconductor alloy 30d. The at least one contact structure 34 is formed by first forming a via contact opening into the dielectric material 32 by lithography and etching. The via contact opening is then filled with a via contact metal such as, for example, Al, W, Cu, and alloys thereof forming contact structure 34. The filling process can include a deposition process such as, for example, plating, sputter, physical vapor deposition or chemical vapor deposition. A planarization process may follow.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a FinFET device comprising:
providing a plurality of semiconductor fins on a surface of a substrate;
forming at least one gate structure orientated perpendicular to and straddling each semiconductor fin of the plurality of semiconductor fins;
providing a composite spacer structure on vertical sidewalls of each gate structure, wherein said composite spacer structure comprises an inner low-k dielectric material portion and an outer nitride material portion and wherein said providing said composite spacer structure comprises forming a dielectric spacer comprising a low-k dielectric material and converting an outer surface of the dielectric spacer into said outer nitride material portion, or depositing a graded spacer profile; and
epitaxially growing a source-side doped semiconductor material portion on an exposed surface of each semiconductor fin and on one side of each gate structure and a drain-side doped semiconductor portion on another exposed surface of each semiconductor fin and on another side of each gate structure.

2. The method of claim 1, wherein said providing said plurality of semiconductor fins comprises lithography and etching of a semiconductor material layer of a semiconductor-on-insulator substrate or an upper semiconductor portion of a bulk semiconductor substrate.

3. The method of claim 1, wherein said at least one gate structure is a functional gate structure comprising a gate dielectric portion and a gate conductor portion.

4. The method of claim 1, wherein said at least one gate structure is a sacrificial gate structure and wherein said sacrificial gate structure is replaced with a functional gate structure after said epitaxially growing said source-side doped semiconductor material portion and said drain-side doped semiconductor portion.

5. The method of claim 1, wherein said providing said composite spacer structure comprises said forming said dielectric spacer comprising said low-k dielectric material and said converting said outer surface of said dielectric spacer into said outer nitride material portion and said converting is selected from the group consisting of decoupled plasma nitridation, plasma treatment, a rapid thermal anneal in a nitrogen-containing ambient, and ion implantation of nitrogen.

6. The method of claim 1, further comprising forming a source-side metal semiconductor alloy portion located on a surface of said source-side doped semiconductor material portion and a drain-side metal semiconductor alloy portion located on a surface of said drain-side doped semiconductor material portion.

7. The method of claim 6, further comprising forming a dielectric material having at least one contact structure located therein.

8. The method of claim 1, wherein said inner low-k dielectric material portion of said composite spacer structure is selected from the group consisting of SiOCN, SiCBN, SiCOH, SiCN and SiON.

9. A FinFET device comprising:
a plurality of semiconductor fins located on a surface of a substrate;
at least one gate structure orientated perpendicular to and straddling each semiconductor fin of the plurality of semiconductor fins;
a composite spacer structure located on vertical sidewalls of each gate structure, wherein said composite spacer structure comprises an inner low-k dielectric material portion and an outer nitride material portion, wherein said outer nitride material portion comprises a same low-k dielectric material as said inner low-k dielectric material portion and has a higher nitrogen content than said inner low-k dielectric material portion;
a source-side doped semiconductor material portion on an exposed surface of each semiconductor fin and on one side of each gate structure; and
a drain-side doped semiconductor portion on another exposed surface of each semiconductor fin and on another side of each gate structure.

10. The FinFET device of claim 9, further comprising a source-side metal semiconductor alloy portion located on a surface of said source-side doped semiconductor material portion and a drain-side metal semiconductor alloy portion located on a surface of said drain-side doped semiconductor material portion.

11. The FinFET device of claim 10, further comprising a dielectric material located atop at least said substrate and said plurality of semiconductor fins, wherein said dielectric material includes at least one contact structure located therein.

12. The FinFET device of claim 9, wherein said substrate is an insulator layer of a semiconductor-on-insulator substrate.

13. The FinFET device of claim 9, wherein said substrate is a semiconductor portion of a bulk semiconductor substrate.

14. The FinFET device of claim 9, wherein said inner low-k dielectric material portion of said composite spacer structure is selected from the group consisting of SiOCN, SiCBN, SiCOH, SiCN and SiON.

15. The FinFET device of claim 9, wherein each semiconductor fin of said plurality of semiconductor fins comprises single crystalline silicon.

16. The FinFET device of claim 9, wherein said gate structure is a functional gate structure comprising a gate dielectric portion and a gate conductor portion.

17. The FinFET device of claim 9, wherein said source-side doped semiconductor material portion, said drain-side doped semiconductor portion, and each of said semiconductor fins of said plurality of semiconductor fins comprises a same semiconductor material.

18. A FinFET device comprising:
a plurality of semiconductor fins located on a surface of a substrate;
at least one gate structure orientated perpendicular to and straddling each semiconductor fin of the plurality of semiconductor fins;
a composite spacer structure located on vertical sidewalls of each gate structure, wherein said composite spacer structure comprises an inner low-k dielectric material portion and an outer doped material portion;
a source-side doped semiconductor material portion on an exposed surface of each semiconductor fin and on one side of each gate structure; and
a drain-side doped semiconductor portion on another exposed surface of each semiconductor fin and on another side of each gate structure.

* * * * *